(12) United States Patent
Konno et al.

(10) Patent No.: US 8,164,973 B2
(45) Date of Patent: Apr. 24, 2012

(54) STORAGE APPARATUS AND METHOD OF CONTROLLING STORAGE APPARATUS

(75) Inventors: Yuuji Konno, Kawasaki (JP); Hiroshi Murakami, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 195 days.

(21) Appl. No.: 12/780,004

(22) Filed: May 14, 2010

(65) Prior Publication Data

US 2010/0223488 A1    Sep. 2, 2010

Related U.S. Application Data

(63) Continuation of application No. PCT/JP2007/072562, filed on Nov. 21, 2007.

(51) Int. Cl.
*G11C 8/00* (2006.01)
(52) U.S. Cl. ......... 365/233.11; 365/189.15; 365/189.16; 365/230.06
(58) Field of Classification Search ............. 365/189.15, 365/189.16, 189.12, 233.11, 230.03, 230.06
See application file for complete search history.

(56) References Cited

U.S. PATENT DOCUMENTS

| | | | |
|---|---|---|---|
| 4,941,127 A | | 7/1990 | Hashimoto |
| 5,524,098 A | * | 6/1996 | Holland et al. ............... 365/219 |
| 5,555,527 A | * | 9/1996 | Kotani et al. ................ 365/222 |
| 5,617,367 A | * | 4/1997 | Holland et al. ............... 365/219 |
| 5,949,733 A | * | 9/1999 | Kotani et al. ............ 365/230.03 |
| 6,023,440 A | * | 2/2000 | Kotani et al. ............ 365/230.03 |
| 2006/0069845 A1 | * | 3/2006 | Ishida et al. ....................... 711/4 |

FOREIGN PATENT DOCUMENTS

| | | |
|---|---|---|
| JP | 64-27087 | 1/1989 |
| JP | 2-180456 | 7/1990 |
| JP | 7-57492 | 3/1995 |

OTHER PUBLICATIONS

Form PCT/ISA/210, mailed Aug. 12, 2008, in corresponding PCT Application No. PCT/JP2007/072562 (2 pp.).
Form PCT/ISA/220, mailed Aug. 12, 2008, in corresponding PCT Application No. PCT/JP2007/072562 (4 pp.).
Form PCT/ISA/237, mailed Aug. 12, 2008, in corresponding PCT Application No. PCT/JP2007/072562 (3 pp.).
English Translation of the International Preliminary Report on Patentability issued Jun. 8, 2010 in corresponding International Patent Application PCT/JP2007/072562.

* cited by examiner

*Primary Examiner* — Gene Auduong
(74) *Attorney, Agent, or Firm* — Staas & Halsey LLP

(57) ABSTRACT

A storage apparatus includes: a plurality of storage sections each of which corresponds to each of a plurality of addresses; a read pointer register that outputs a read pointer indicating an address of a storage section from which data is read; a write pointer register that outputs a write pointer indicating an address of a storage section to which data is written; a control circuit that receives first clock signals of a first frequency and second clock signals of a second frequency that is different from the first frequency, determines selection signals indicating either the first clock signals or the second clock signals on the basis of the read pointer or the write pointer for each of the plurality of storage sections, and outputs the selection signals; and selection circuits selects signals indicated by the selection signals, and outputs the selected signals.

11 Claims, 12 Drawing Sheets

STORAGE APPARATUS AND METHOD OF CONTROLLING STORAGE APPARATUS

CROSS-REFERENCE TO RELATED APPLICATIONS

This application is a continuation application, filed under 35 U.S.C. §111(a), of PCT Application No. PCT/JP2007/072562, filed on Nov. 21, 2007, the disclosure of which is herein incorporated in its entirety by reference.

FIELD

The embodiments discussed herein are related to a storage apparatus and a method of controlling the storage apparatus.

BACKGROUND

For example, a computer system, such as a server or an information processing apparatus, in which a plurality of physical CPUs (Central Processing Units) share a memory space carries out an exchange of information between nodes through packet communication with each physical CPU acting as a node. A XB (Crossbar; Crossbar switch; Data transfer device) that is provided between the nodes and has a function of transferring data between the nodes requires a large-capacity RAM (Random Access Memory) as a buffer for data to be transferred.

FIG. 12 is a circuit diagram illustrating an example of the configuration of a buffer section in a data transfer circuit. The buffer section includes a write pointer register 11 that stores a write pointer; a read pointer register 12 that stores a read pointer; a storage section 13 that stores data; a write address selector 14 that selects a write address of the storage section 13 in accordance with the write pointer register 11; a read address selector 15 that selects a read address of the storage section 13 in accordance with the read pointer register 12; and a clock supply circuit 16 that supplies clocks to each portion of the storage section 13. In such a buffer section, writing and reading access to the storage section 13 is performed for each of the addresses per unit of time, and the address to be accessed is determined by the write pointer and the read pointer.

The write pointer register 11 and the read pointer register 12 are each realized by local counters. When an access demand emerges, the pointer registers each perform a writing or reading process of an address specified by the pointers (counter values) at the time and increase the pointers by one. That is, the pointer points to the next address to be accessed. When it is found that the pointers are equal to each other as a result of comparison of the pointers' values, then effectively the storage section 13 stores no data ("EMPTY" in FIG. 12). Accordingly, the reading of data from the storage section 13 is not performed. Therefore, it is possible to avoid underflow, which is caused by a reading access when the storage section 13 has no data.

FIG. 13 is a circuit diagram illustrating an example of a clock supply circuit that supplies clocks to the storage section. The clock supply circuit 16 includes a clock generation circuit 60 and continuously supplies clocks generated by the clock generation circuit 60 to all storage areas of the storage section 13. Incidentally, the clock generation circuit 60 may be provided outside the clock supply circuit 16 or the buffer section.

As a relevant technique, there is a data shift circuit designed to reduce power consumption.

[Patent Document 1] Japanese Laid-open Patent Publication No. 07-057492

The problem with the above clock supply circuit is that since clocks are continuously supplied to the storage section 13, power is consumed wastefully.

SUMMARY

According to an aspect of the invention, a storage apparatus is provided. The storage apparatus includes: a plurality of storage sections each of which corresponds to each of a plurality of addresses; a read pointer register that outputs a read pointer indicating an address of a storage section from which data is read, out of the plurality of storage sections; a write pointer register that outputs a write pointer indicating an address of a storage section to which data is written, out of the plurality of storage sections; a control circuit that receives first clock signals of a first frequency and second clock signals of a second frequency that is different from the first frequency, determines selection signals indicating either the first clock signals or the second clock signals on the basis of the read pointer or the write pointer for each of the plurality of storage sections, and outputs the selection signals; and selection circuits each of which is so provided as to correspond to each of the plurality of storage sections, selects signals indicated by the selection signals for each of the plurality of storage sections out of the first and second clock signals, and outputs the selected signals to each of the plurality of storage sections.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Regarding the above problem, it can be considered that in the storage section 13 having the RAM, CE (Chip Enable) is disabled when the storage section 13 is not being accessed in order to reduce power consumption. However, even the above method has little effect on reducing power consumption when the storage section 13 is being continuously accessed because clocks are supplied to many areas that are not accessed during the process of accessing the storage section 13.

Hereinafter, embodiments of the present invention will be described with reference to the accompanying drawings.

The following describes a XB as an example of application of the present invention.

Figure 1:
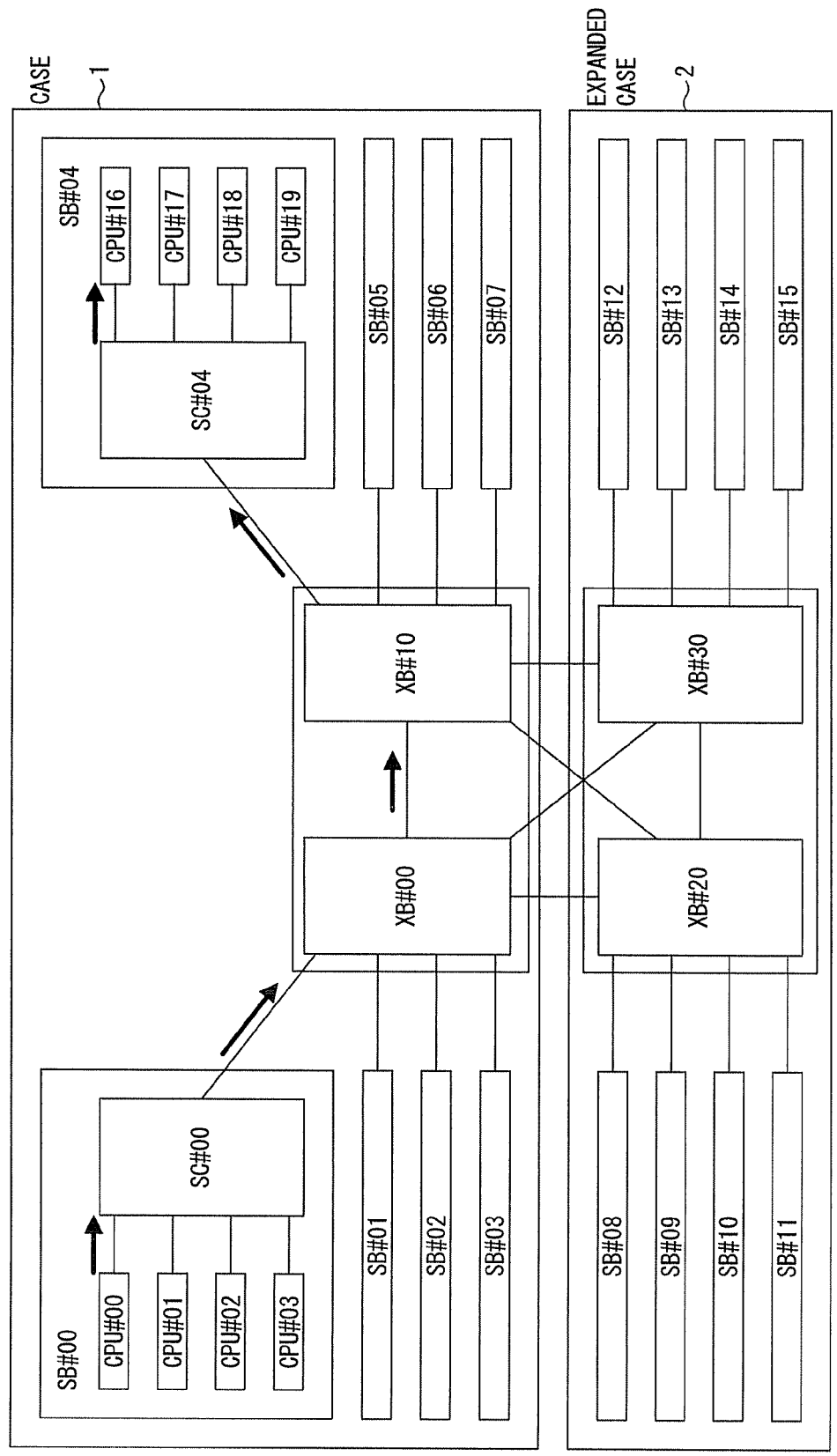
FIG. 1 is a block diagram illustrating an example of the configuration of a server system according to a first embodiment of the present invention.

FIG. 1 is a block diagram illustrating an example of the configuration of a server system according to the present embodiment. The server system includes a case 1 and an expanded case 2. The case 1 includes a plurality of SBs (System Boards) and a plurality of XBs. The XB is a LSI having a function of transferring data between the SBs. The XBs are represented by XB#00 and XB#10, respectively. Each SB is a board having at least one CPU and SC (System Controller). The SBs are represented by SB#00, SB#01, SB#02, SB#03, SB#04, SB#05, SB#06 and SB#07, respectively. The SC is a LSI having an interface function for communication between the SBs. In each SB, each CPU is connected to the SC. Each SC is connected to the XB.

In the example here, SB#00 includes four CPUs (CPU#00, CPU#01, CPU#02 and CPU#03) and one SC (SC#00). Similarly, SB#04 includes four CPUs (CPU#16, CPU#17, CPU#18 and CPU#19) and one SC (SC#04).

The XB is connected to the other XBs and a plurality of SCs. In the example here, XB#00 is connected to the SCs of SB#00, SB#01, SB#02 and SB#03 and also to XB#10, XB#20 and XB#30. XB#10 is connected to the SCs of SB#04, SB#05, SB#06 and SB#07 and also to XB#00, XB#20 and XB#30.

The following describes an example of a path for packets transferred from a CPU to another CPU. With CPU#00 of SB#00 as the source of packets and CPU#16 of SB#04 as the destination of the packets, the packets are transmitted from CPU#00 to CPU#16 via SC#00, XB#00, XB#10 and SC#04 as indicated by an arrow in FIG. 1.

The following describes the configuration of the XB according to the present embodiment.

Figure 2:
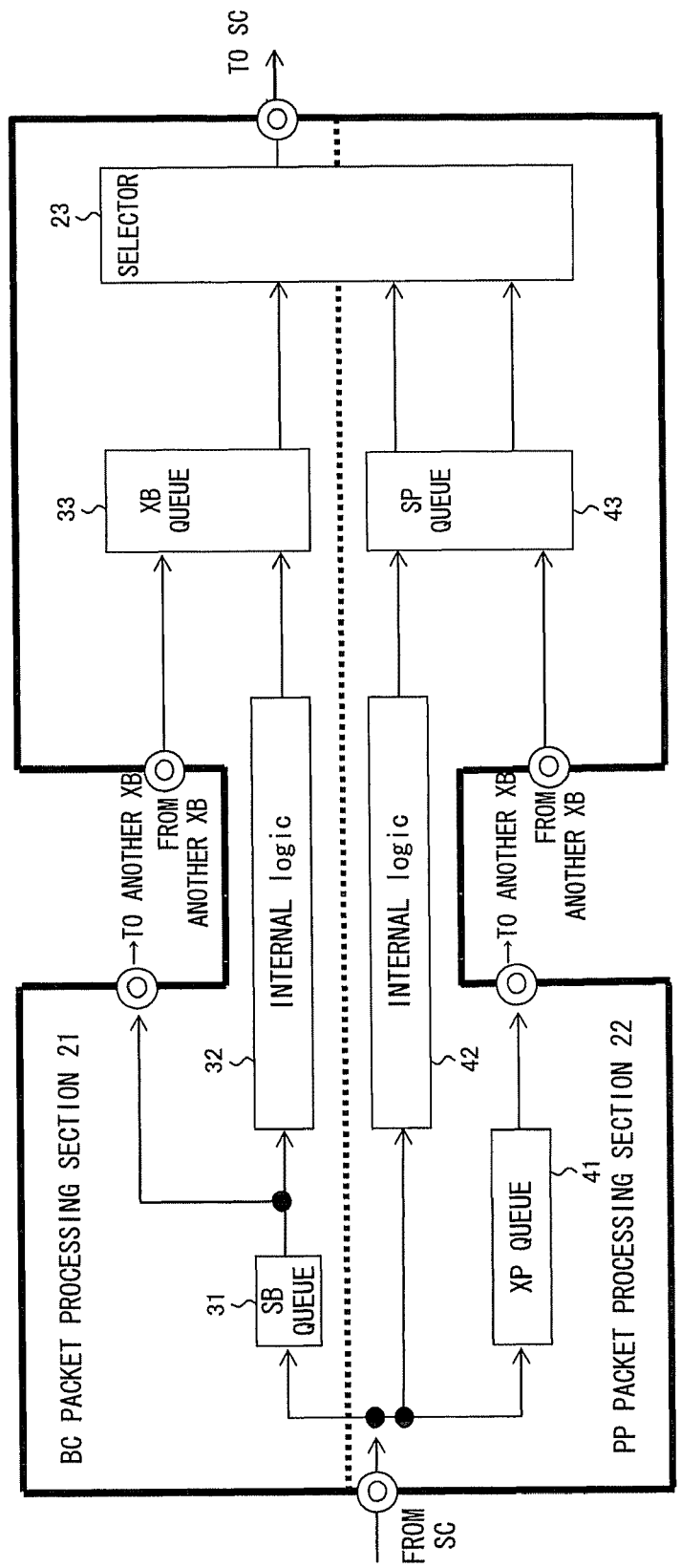
FIG. 2 is a block diagram illustrating an example of the configuration of a XB according to the first embodiment.

FIG. 2 is a block diagram illustrating an example of the configuration of the XB of the present embodiment. The XB includes a BC (Broad Cast) packet processing section 21, a PP (Peer-to-Peer) packet processing section 22 and a selector 23. The BC packet processing section 21 processes BP packets and includes a SB queue 31, an internal logic 32 and a XB queue 33. The PP packet processing section 22 processes PP packets and includes a XP queue 41, an internal logic 42 and a SP queue 43.

The SB queue 31 receives BC packets from each SB. The XB queue 33 receives BC packets from all the XBs. The internal logic 32 transfers BC packets from the SB under the control of the XB that includes the internal logic 32 to another SB under the control of the XB that includes the internal logic 32; and includes a pipeline structure. The XP queue 41 receives PP packets addressed to the SB under the control of another XB. The SP queue 43 receives PP packets addressed to the SB under the control of the XB that includes the SP queue 43. The internal logic 42 transfers PP packets from the SB under the control of the XB that includes the internal logic 42 to another SB under the control of the XB that includes the internal logic 42; and includes a pipeline structure. The selector 23 selects either packets outputted from the BC packet processing section 21 or from the PP packet processing section 22 to transmit the selected packet to the SC.

The XB queue 33, the XP queue 41 and the SP queue 43 are each realized by a buffer section described below that includes a RAM for buffering packets. The SB queue 31 may be realized by the buffer section described below.

The following describes the configuration of the buffer section according to the present embodiment.

Figure 3:
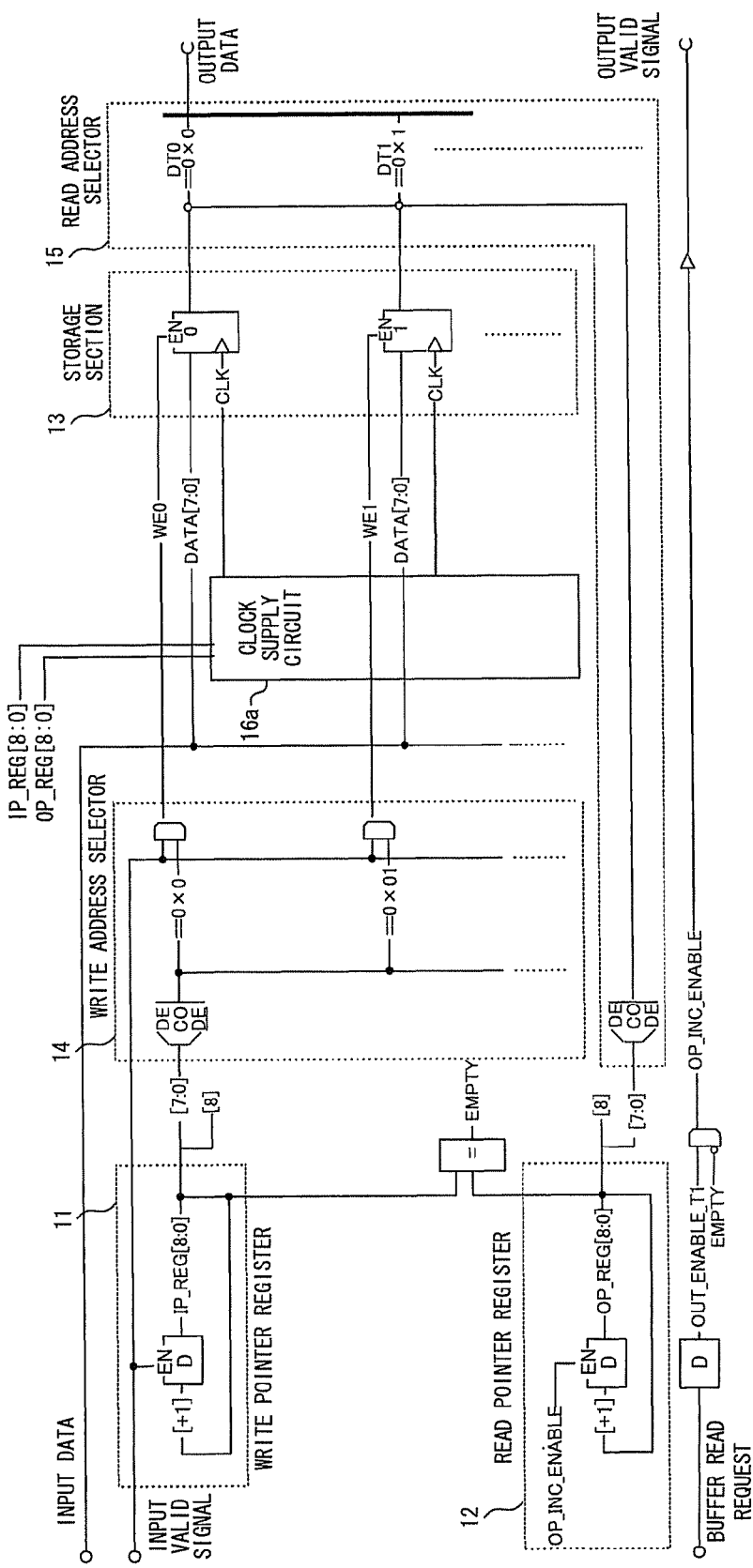
FIG. 3 is a circuit diagram illustrating an example of the configuration of a buffer section according to the first embodiment.
Figure 12:
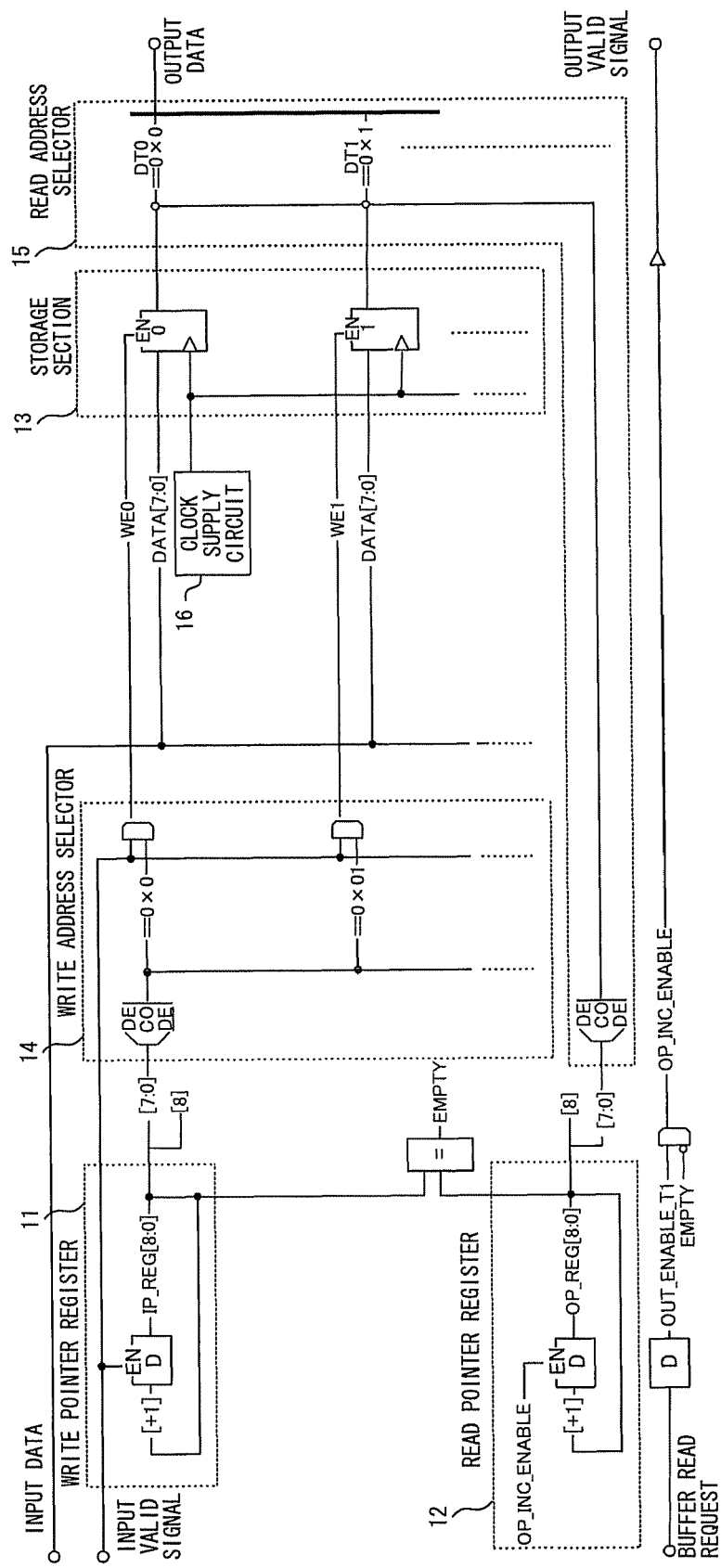
FIG. 12 is a circuit diagram illustrating an example of the configuration of a buffer section in a data transfer circuit.
Figure 13:
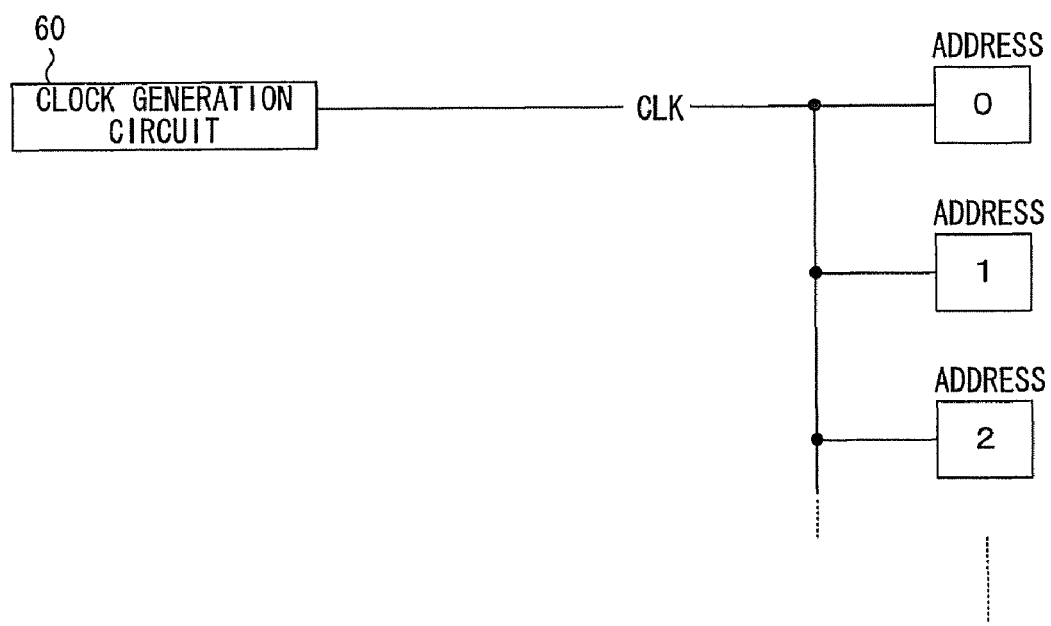
FIG. 13 is a circuit diagram illustrating an example of a clock supply circuit for a storage section.

FIG. 3 is a circuit diagram illustrating an example of the configuration of the buffer section of the present embodiment. In FIG. 3, the same reference symbols as those used in FIG. 12 represent the same components or equivalents, which are therefore not described here. As illustrated in FIG. 3, as compared to FIG. 12, there is a clock supply circuit 16a instead of the clock supply circuit 16. Hereinafter, suppose that the storage section 13 is a ring buffer including eight memory cells. The clock supply circuit 16a is capable of supplying clocks to respective memory cells in the storage section 13.

The following describes the configuration of the clock supply circuit 16a of the present embodiment.

Figure 4:
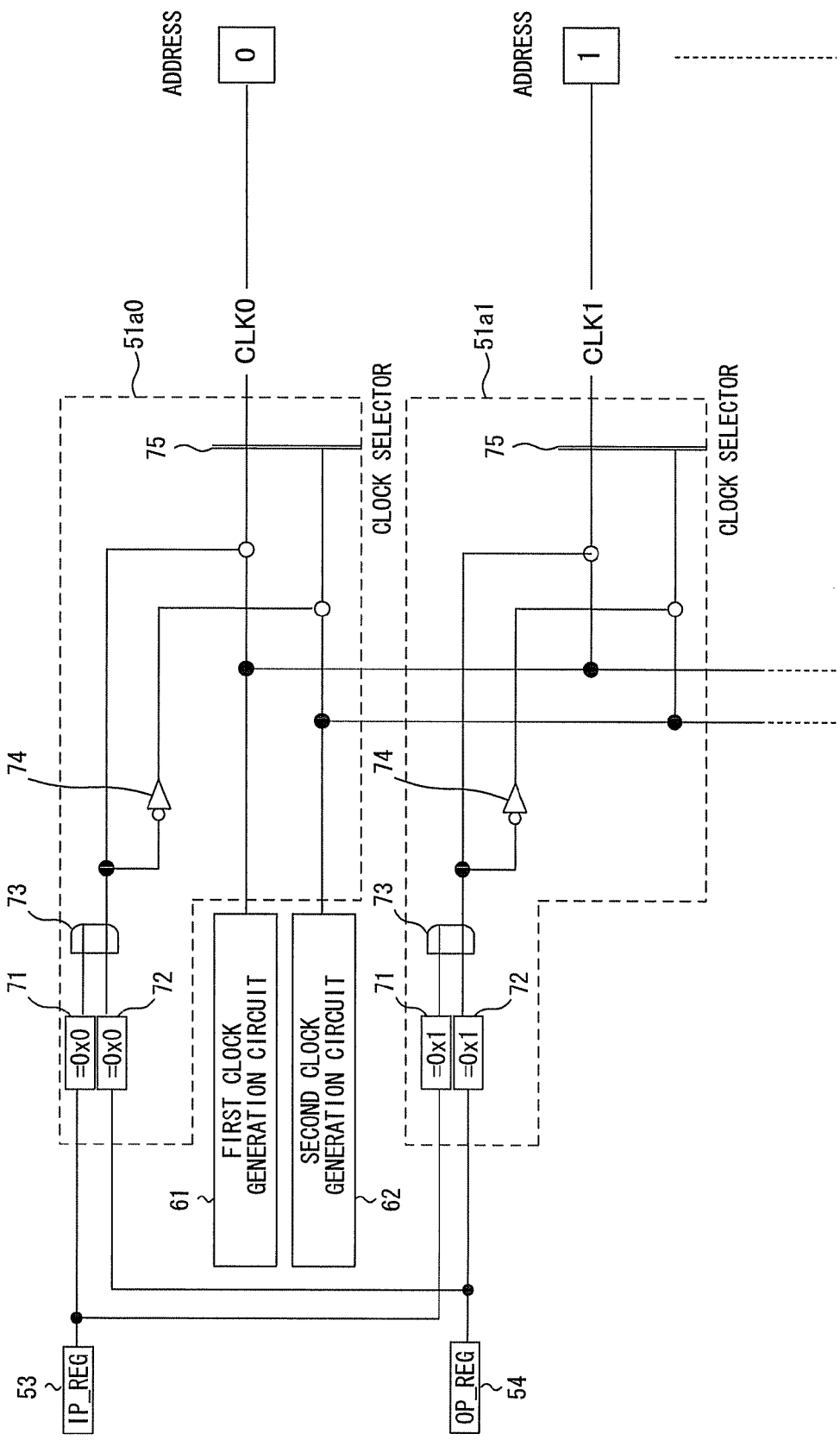
FIG. 4 is a circuit diagram illustrating an example of the configuration of a clock supply circuit according to the first embodiment.

FIG. 4 is a circuit diagram illustrating an example of the configuration of the clock supply circuit 16a of the present embodiment. The clock supply circuit 16a includes clock selectors 51a0 and 51a1 that are provided for each address of the storage section 13; a first clock generation circuit 61 that generates first clocks (first clock signals); and a second clock generation circuit 62 that generates second clocks (second clock signals). Incidentally, the first clock generation circuit 61 and the second clock generation circuit 62 may be provided outside the clock supply circuit 16a or the buffer section. Since the storage section 13 is a ring buffer including eight memory cells, the address (write pointer; read pointer) i of the memory cell of the storage section 13 is represented as a remainder after division of a serial value by eight (i=0, 1, . . . ,7).

The clock selectors 51a0 and 51a1 each have a write pointer register 53, a read pointer register 54, two determination circuits 71 and 72, a two-input OR circuit (two-input logical sum circuit) 73, a NOT circuit (inhibit circuit) 74 and a selector 75. In FIG. 4, the two determination circuits 71 and 72 make a determination as to whether the write pointer IP_REG[8:0] is equal to 0x0 or whether the read pointer OP_REG[8:0] is equal to 0x0, or make a determination as to or whether the write pointer IP_REG[8:0] is equal to 0x1 or whether the read pointer OP_REG[8:0] is equal to 0x1. Here, "0x" is a prefix meaning the subsequent values are given in hexadecimal. Incidentally, the two determination circuits 71 and 72 and the two-input OR circuit 73 correspond to a control circuit; the NOT circuit 74 and the selector 75 correspond to a selection circuit. The output from the two-input OR circuit 73 corresponds to selection signals. In the clock selectors 51a0 and 51a1 that correspond to the address i, the determination circuit 71 makes a determination as to whether the write pointer IP_REG [8:0] is equal to i (i=0x0 or i=0x1);

the determination circuit 72 makes a determination as to whether the read pointer OP_REG [8:0] is equal to i (i=0x0 or i=0x1). The results of the two determination circuits 71 and 72 are inputted to the two-input OR circuit. When it is determined by the two determination circuits 71 and 72 that either one of the pointers is equal to i, the two-input OR circuit 73 outputs 1. That is, when the value of the write pointer IP_REG [8:0] or read pointer OP_REG [8:0] is equal to i (i=0x0 or i=0x1), the two-input OR circuit 73 outputs 1.

Thanks to the above configuration, when the write pointer IP_REG [8:0] is equal to i or when the read pointer OP_REG [8:0] is equal to i, the clock selectors 51a0 and 51a1 that correspond to the address i supply the first clocks to the address is portion of the storage section 13. When the write pointer IP_REG [8:0] is not equal to i or when the read pointer OP_REG [8:0] is not equal to i, the clock selectors 51a0 and 51a1 supply the second clocks to the address is portion of the storage section 13. That is, based on the output from the determination circuits 71 and 72, the selector 75 exclusively switches to the first or second clocks to output. Therefore, the portion of the storage section 13 that corresponds to the address specified by the write pointer register 11 or the read pointer register 12 operates at the first clocks, and the portions of the storage section 13 that correspond to the other addresses operate at the second clocks. The first clocks have a normal frequency (first frequency). The normal frequency is for example a maximum frequency. The second clocks have a lower frequency (second frequency) than the first clocks.

The following describes the operation of a buffer section according to the present embodiment.

Figure 5:
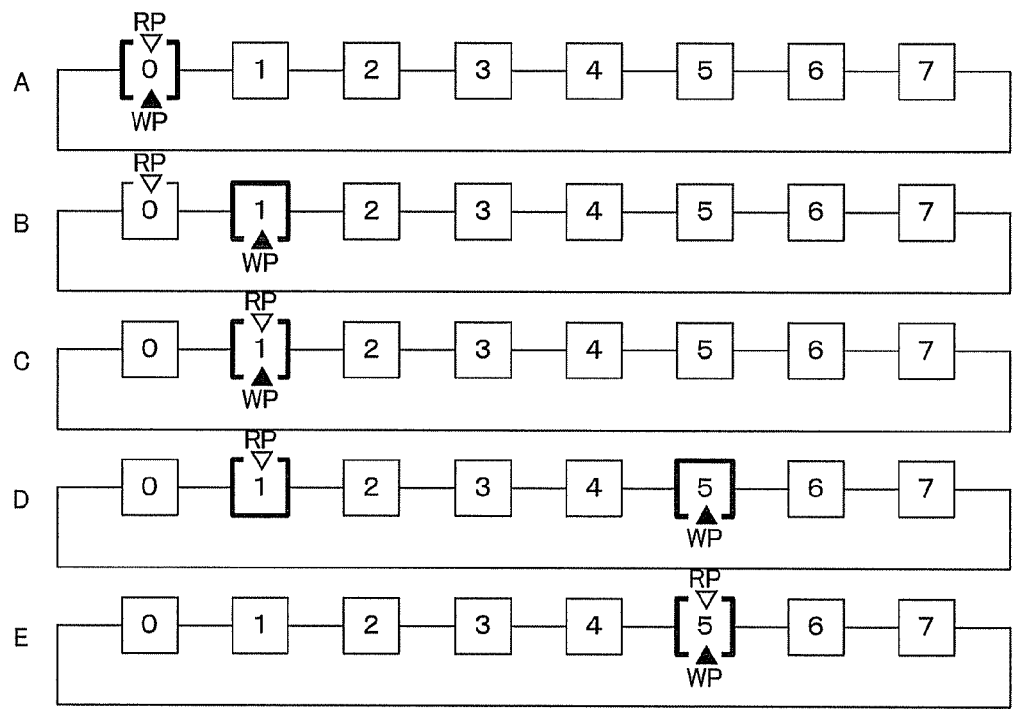
FIG. 5 is a schematic diagram illustrating an example of the operation of a storage section according to the first embodiment.

FIG. 5 is a schematic diagram illustrating an example of the operation of the storage section 13 according to the present embodiment. Hereinafter, suppose that the write pointer of the write pointer register 11 is WP and the read pointer of the read pointer register 12 is RP. Data is written in the following order: the address 0, the address 1, the address 2, . . . . After data is written to the last address 7, the next address for WP is the address 0. The same holds for reading.

FIG. 5 also illustrates five states A, B, C, D and E of the storage section 13. Moreover, in FIG. 5, the memory cells encircled by bold frames are those to which the first clocks are supplied. The other memory cells, not encircled by bold frames, are those to which the second clocks are supplied.

In the state A, the storage section 13 has no data, with WP and RP pointing to the address 0. In the state B, after the state A, data is written to the address 0 and WP moves from the address 0 to the address 1. Here, the written data is stored in the address 0 and RP remains at the address 0. In the state C, after the state B, the storage section 13 becomes empty as data is read from the address 0, with both WP and RP pointing to the address 1. In the state D, after the state C, data have been written to four addresses in a row in the storage section 13. Here, WP has moved to the address 5. In the state E, after the state D, the storage section 13 becomes empty as data are read from the addresses 1 to 4, with both WP and RP pointing to the address 5.

As described above, in the storage section 13, the memory cells that operate at the first clocks are only those pointed by WP or RP. The other memory cells continue operating at the second clocks.

Figure 6:
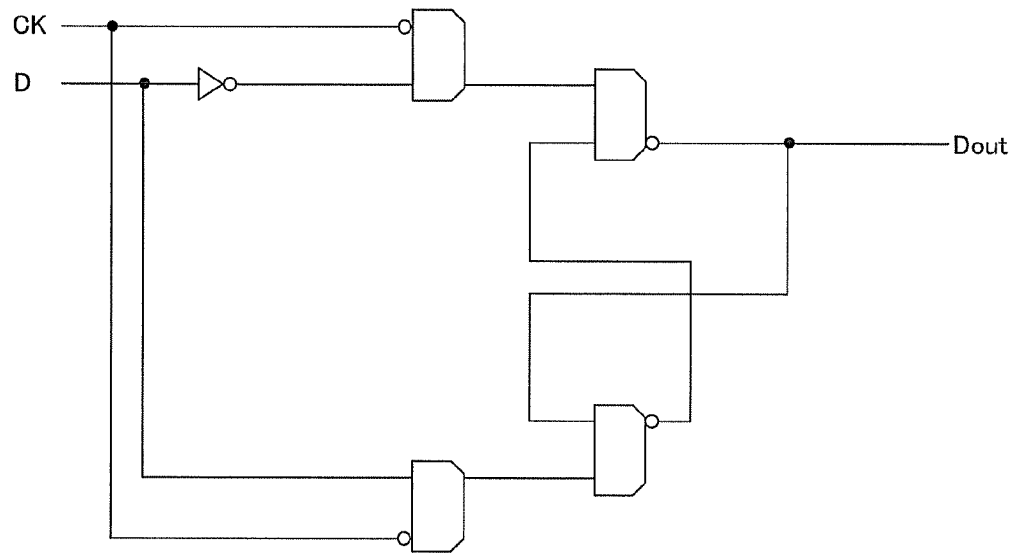
FIG. 6 is a circuit diagram illustrating an example of the configuration of a memory cell of the storage section according to the first embodiment.

Incidentally, instead of supplying the second clocks to the memory cells not corresponding to the write pointer IP_REG [8:0] or read pointer OP_REG [8:0], the supply of clocks to the memory cells not corresponding to the write pointer IP_REG [8:0] or read pointer OP_REG [8:0] may stop. In particular, stopping the supply is effective when the memory cells of the storage section 13 are for example FFs (Flip Flops) so the memory cells can keep operating without clocks. FIG. 6 is a circuit diagram illustrating an example of the configuration of a memory cell of the storage section according to the present embodiment. The memory cell is realized by FFs; when the value of the CK input is 0, the value of the D input is stored and the stored value is outputted from the Dout output.

When clocks with a refresh rate of more than a predetermined value needs to be supplied to the memory cells of the storage section 13 that are for example DRAM, the period of the second clocks are so set as to be longer than the period of the first clocks and less than and equal to the refresh period of the storage section 13. In order to make clock control simple, the first clocks may be the result of multiplying the second clocks.

According to the present embodiment, the first clocks are supplied to only the memory cells to be accessed; the second clocks or no clocks are supplied to the remaining memory cells. Therefore, it is possible to reduce the power consumption of the buffer section. The reduction in power consumption could be more effective as the scale of the buffer section gets larger like the XB.

The configuration of a server system and XBs of the present embodiment is the same as in the first embodiment. The configuration of the buffer section of the present embodiment is different from that of the first embodiment.

Figure 7:
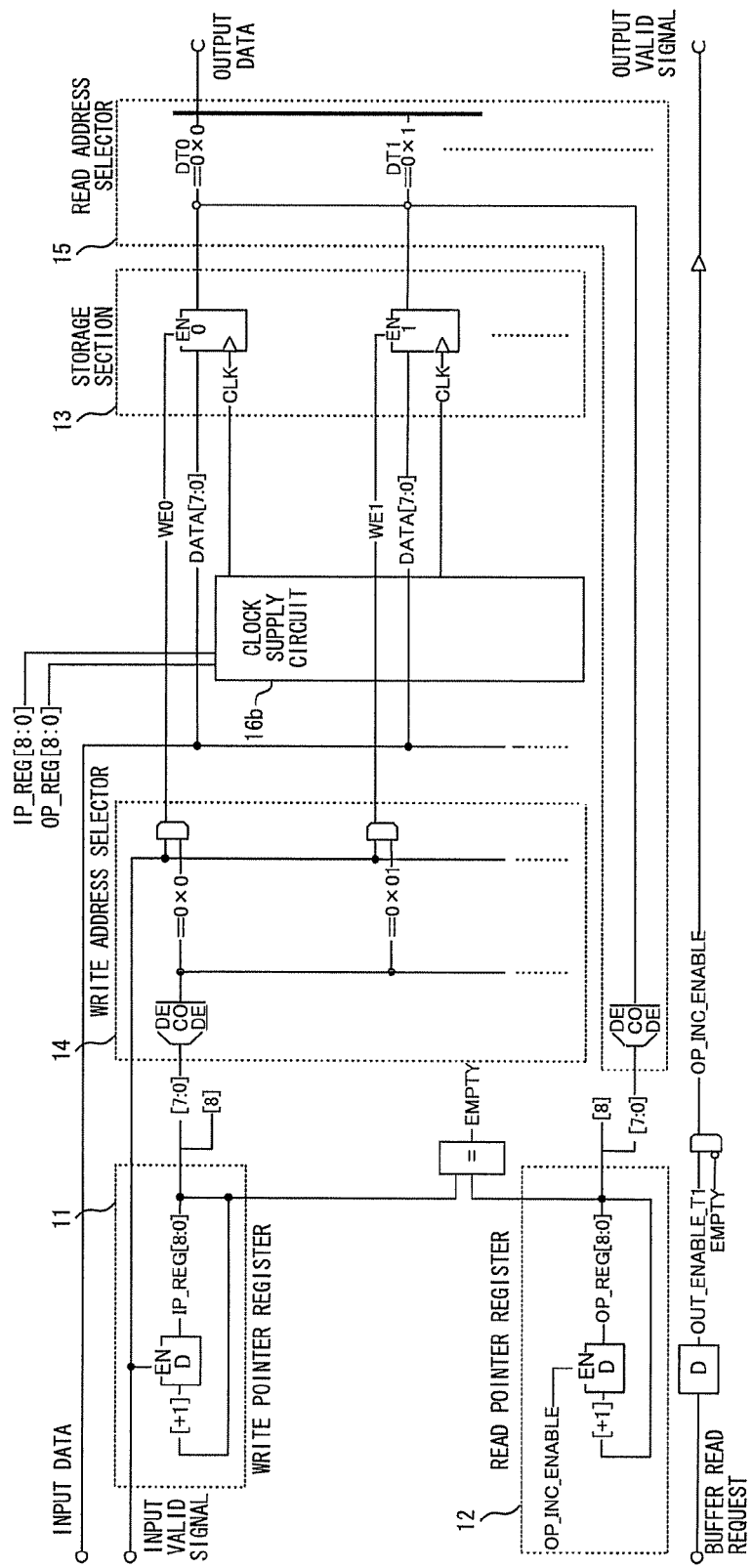
FIG. 7 is a circuit diagram illustrating an example of the configuration of a buffer section according to a second embodiment of the present invention.

FIG. 7 is a circuit diagram illustrating an example of the configuration of the buffer section of the present embodiment. In FIG. 7, the same reference symbols as those used in FIG. 3 represent the same components or equivalents, which are therefore not described here. As illustrated in FIG. 7, as compared to FIG. 3, there is a clock supply circuit 16b instead of the clock supply circuit 16a. The clock supply circuit 16b supplies clocks to each memory cell in the storage section 13.

The following describes the configuration of the clock supply circuit 16b of the present embodiment.

Figure 8:
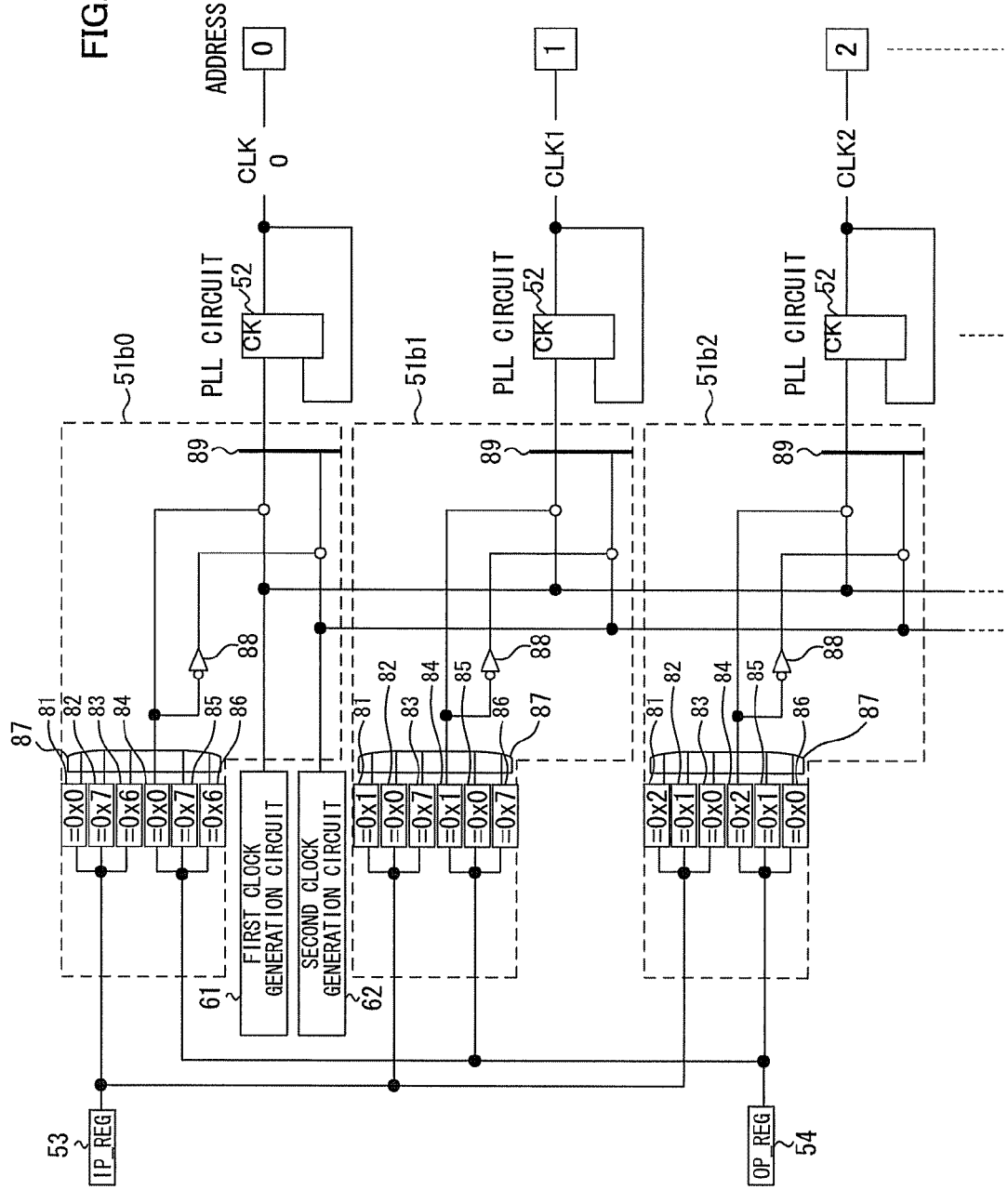
FIG. 8 is a circuit diagram illustrating an example of the configuration of a clock supply circuit according to the second embodiment.

FIG. 8 is a circuit diagram illustrating an example of the configuration of the clock supply circuit 16b of the present embodiment. In FIG. 8, the same reference symbols as those used in FIG. 4 represent the same components or equivalents, which are therefore not described here. The clock supply circuit 16b includes clock selectors 51b0, 51b1 and 51b2 instead of the clock selectors 51a0 and 51a1. The clock supply circuit 16b also includes a new component, a PLL (Phase Locked Loop) circuit 52.

Figure 9:
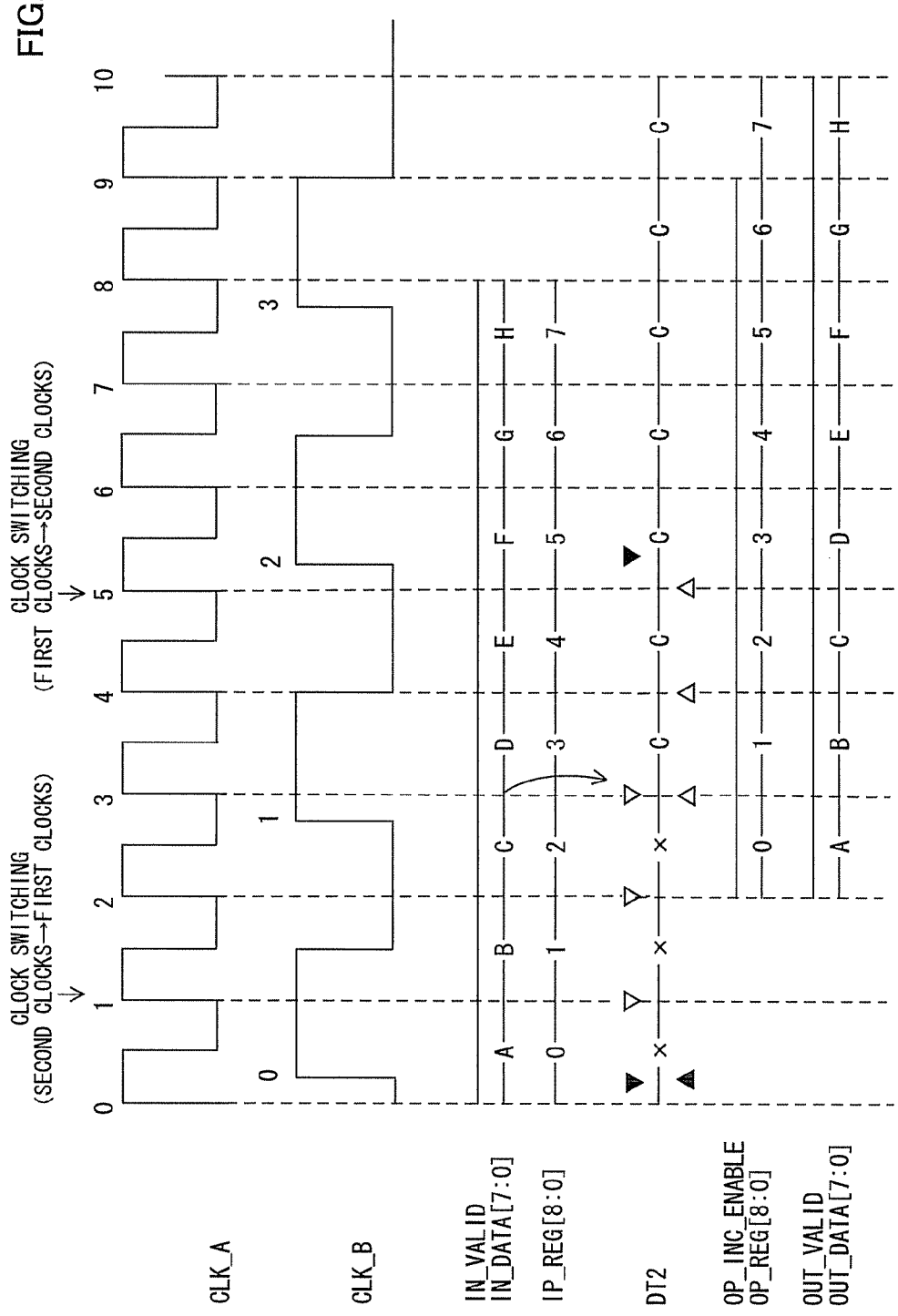
FIG. 9 is a timing chart illustrating an example of the operation of the buffer section according to the second embodiment.

The clock selectors 51b0, 51b1 and 51b2 each have a write pointer register 53, a read pointer register 54, six determination circuits 81, 82, 83, 84, 85 and 86, a six-input OR circuit 87, a NOT circuit 88 and a selector 89. In FIG. 9, the six determination circuits 81, 82, 83, 84, 85 and 86 make a determination as to whether the write pointer IP_REG[8:0] is equal to 0x0, 0x7 or 0x6 or whether the read pointer OP_REG [8:0] is equal to 0x0, 0x7 or 0x6, or make a determination as to whether the write pointer IP_REG[8:0] is equal to 0x1, 0x0 or 0x7 or whether the read pointer OP_REG[8:0] is equal to 0x1, 0x0 or 0x7, or make a determination as to whether the write pointer IP_REG[8:0] is equal to 0x2, 0x1 or 0x0 or whether the read pointer OP_REG[8:0] is equal to 0x2, 0x1 or 0x0. Incidentally, the six determination circuits 81, 82, 83, 84, 85 and 86 and the six-input OR circuit 87 correspond to a control circuit; the NOT circuit 88 and the selector 89 correspond to a selection circuit. The output from the six-input OR circuit 87 corresponds to selection signals.

The PLL circuit 52 carries out the skew adjustment of clocks outputted from the clock selectors 51b0, 51b1 and 51b2. The output from the PLL circuit 52 is fed back to the PLL circuit 52. The PLL circuit 52 may receive reference clock signals to adjust the phase of the output of the clock selectors 51b0, 51b1 and 51b2 on the basis of the phase of the reference clock signals.

Moreover, since it takes time for the PLL circuit 52 to output stable clocks, it is necessary to enable the first clocks to be selected in advance in the clock selectors 51b0, 51b1 and 51b2 of an area a predetermined number of addresses ahead of an access-target address, as well as selecting the first clocks for the access-target address.

When the period of the first clocks is τ, the time that the PLL circuit 52 takes to output stable clocks is 2τ. Regarding the six determination circuits 81, 82, 83, 84, 85 and 86, in the clock selectors 51b0, 51b1 and 51b2 corresponding to the address i, the determination circuit 81 makes a determination as to whether the write pointer is equal to i (0x0, 0x1 and 0x2 in the clock selectors 51b0, 51b1 and 51b2); the determination circuit 82 makes a determination as to whether the write pointer is equal to i−1 (0x7, 0x0 and 0x1 in the clock selectors 51b0, 51b1 and 51b2); the determination circuit 83 makes a determination as to whether the write pointer is equal to i−2 (0x6, 0x7 and 0x0 in the clock selectors 51b0, 51b1 and 51b2); the determination circuit 84 makes a determination as to whether the read pointer is equal to i (0x0, 0x1 and 0x2 in the clock selectors 51b0, 51b1 and 51b2); the determination circuit 85 makes a determination as to whether the read pointer is equal to i−1 (0x7, 0x0 and 0x1 in the clock selectors 51b0, 51b1 and 51b2); and the determination circuit 86 makes a determination as to whether the read pointer is equal to i−2 (0x6, 0x7 and 0x0 in the clock selectors 51b0, 51b1 and 51b2). The results of the six determination circuits 81, 82, 83, 84, 85 and 86 are inputted to the six-input OR circuit 87.

According to the above configuration, since it takes time for the PLL circuit 52 to output stable clocks, the clock selectors 51b0, 51b1 and 51b2 corresponding to the addresses i, i−1 and i−2, which are the addresses of an area a predetermined number of addresses ahead of the access-target address, supply the first clocks to the subsequent PLL circuits 52, as well as selecting the first clocks for the access-target address. The other clock selectors 51b0, 51b1 and 51b2 supply the second clocks to the subsequent PLL circuits 52.

The following describes the operation of the buffer section of the present embodiment.

FIG. 9 is a timing chart illustrating an example of the operation of the buffer section of the present embodiment. The timing chart illustrates, from top to bottom, the first clocks (CLK_A) that are outputted from the first clock generation circuit 61 in FIG. 8; the second clocks (CLK_B) that are outputted from the second clock generation circuit 62 in FIG. 8; a flag (IN_VALID) that indicates the data inputted to the storage section 13 becomes valid in FIG. 7; the data (IN_DATA[7:0]) that is inputted to the storage section 13 in FIG. 7; the write pointer (IP_REG[8:0]) that is outputted from the write pointer register 11 in FIG. 7; a flag (OP_INC_ENABLE) that indicates the counting of the read pointer outputted from the read pointer register 12 is enabled in FIG. 7; the content of the address 2 of the storage section 13 (DT2) in FIG. 7; the read pointer (OP_REG[8:0]) that is outputted from the read pointer register 12 in FIG. 7; a flag (OUT_VALID) that indicates the data outputted from the storage section 13 becomes valid in FIG. 7; and the data (OUT_DATA[7:0]) that is outputted from the storage section 13 in FIG. 7.

At the time T0, the write pointer becomes 0 and the clock selectors 51b0, 51b1 and 51b2 corresponding to the address 2 stop supplying the second clocks and then start supplying the first clocks to the subsequent PLL circuits 52. Subsequently, at the time T2, the PLL circuit 52 corresponding to the address 2 becomes stabilized and the write pointer becomes 2. At the time T3, the value of the input data, C, is written to the address 2 of the storage section 13 so the content of the address 2 of the storage section 13 is C. Then, at the time T4, the read pointer becomes 2 and C, the value read out from the address 2 of the storage section 13 is the value of the output data. Subsequently, at the time T5, the write pointer becomes 5; the read pointer becomes 3; and the clock selectors 51b0, 51b1 and 51b2 corresponding to the address 2 stop supplying the first clocks and then start supplying the second clocks to the subsequent PLL circuits 52.

According to the present embodiment, the PLL circuit is used to supply clocks to each memory cell of the storage section 13. Therefore, it is possible to reduce skew among the memory cells. It takes time for the PLL circuit 52 to output stable clocks. Accordingly, the first clocks are not only selected for the access-target address but also supplied in advance to the area a predetermined number of addresses ahead of the access-target address. Thus, the PLL circuit is able to supply stable clocks at the time of access.

Although the configuration of a server system and XBs of the present embodiment is the same as in the first embodiment, the configuration of a buffer section of the present embodiment is different from that of the first embodiment.

Figure 10:
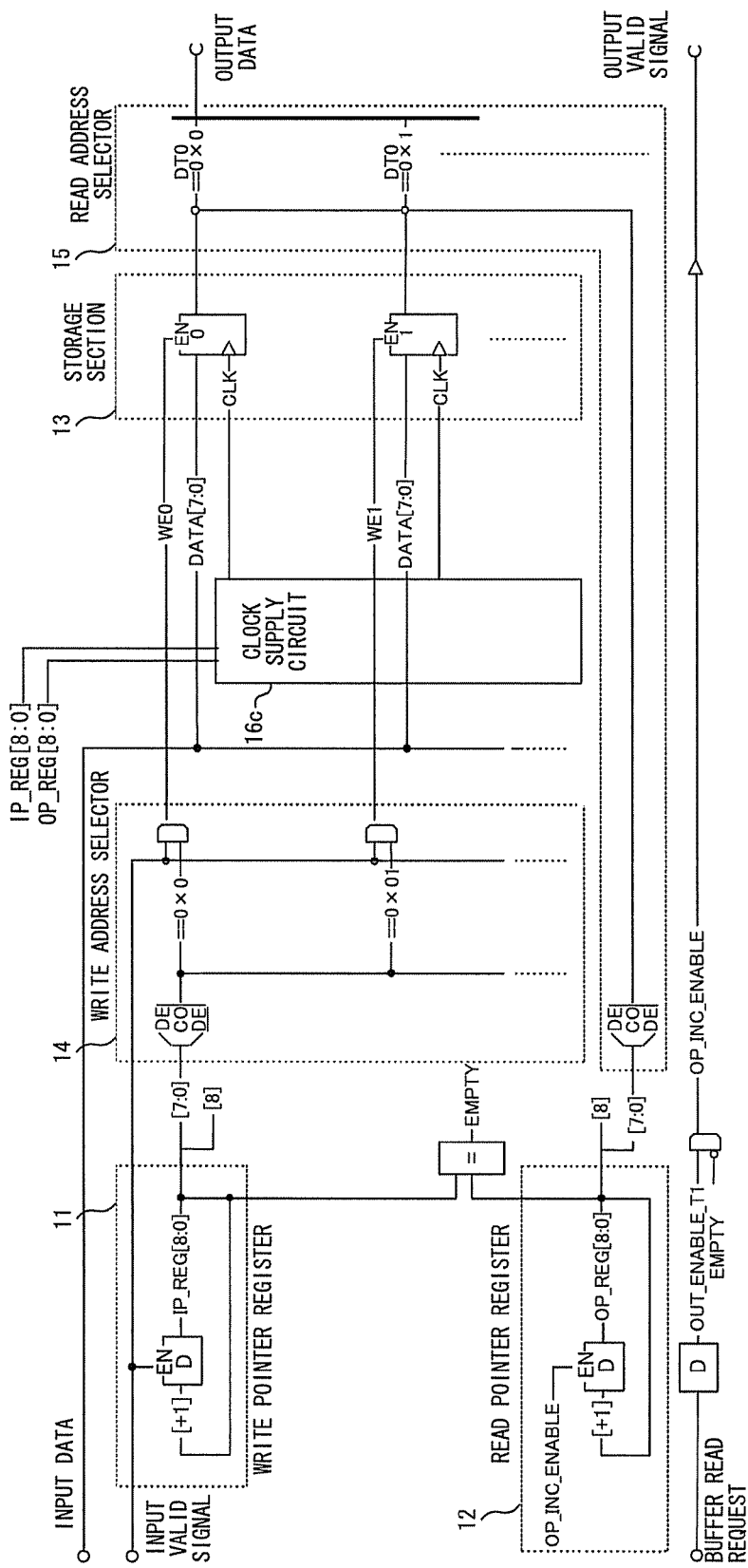
FIG. 10 is a circuit diagram illustrating an example of the configuration of a buffer section according to a third embodiment of the present invention.

FIG. 10 is a circuit diagram illustrating an example of the configuration of the buffer section according to the present embodiment. In FIG. 10, the same reference symbols as those used in FIG. 3 represent the same components or equivalents, which are therefore not described here. As illustrated in FIG. 10, as compared to FIG. 3, there is a clock supply circuit 16c instead of the clock supply circuit 16a.

The following describes the configuration of the clock supply circuit 16c of the present embodiment.

Figure 11:
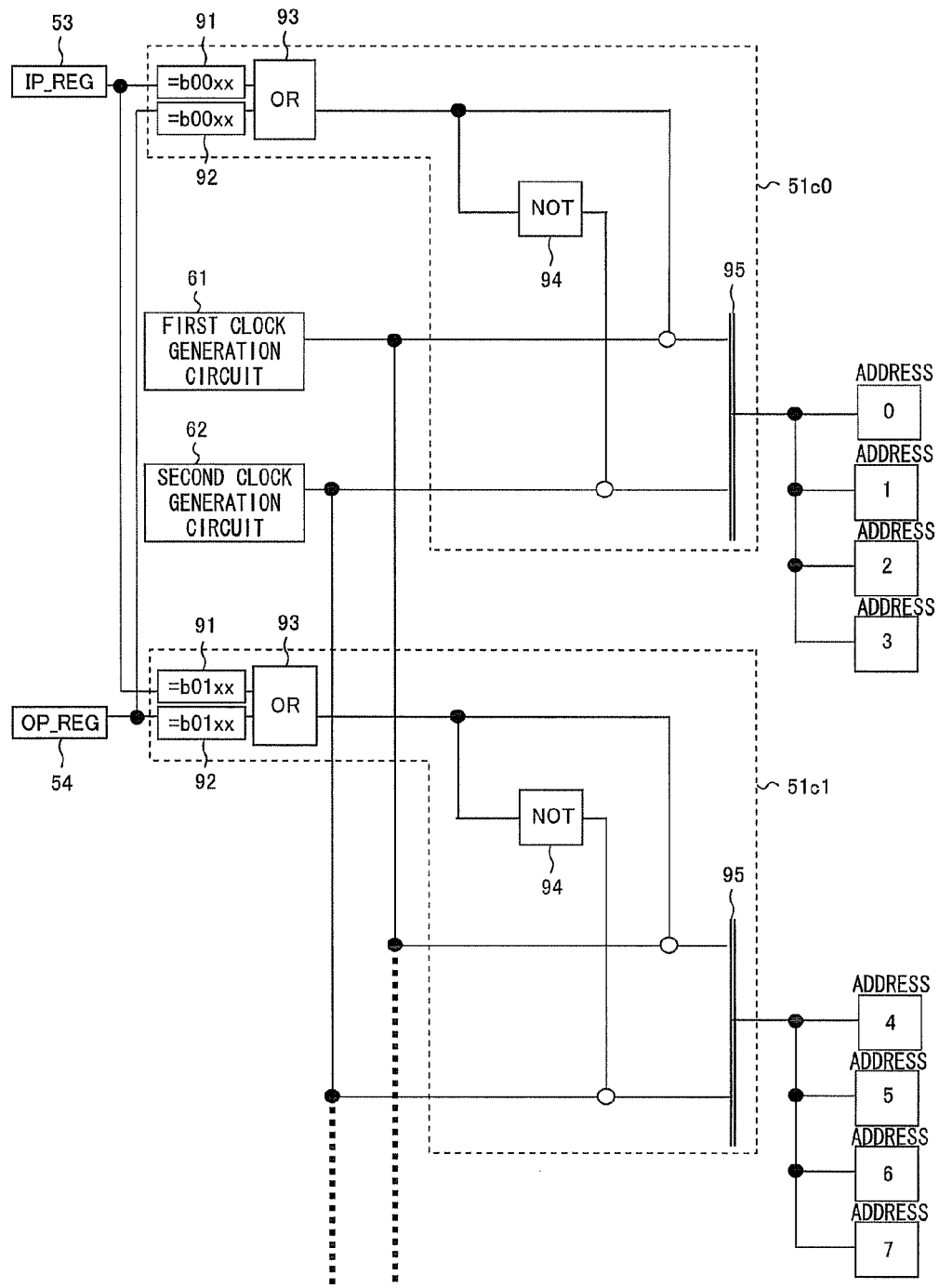
FIG. 11 is a circuit diagram illustrating an example of configuration of a clock supply circuit according to the third embodiment.

FIG. 11 is a circuit diagram illustrating an example of the configuration of the clock supply circuit of the present embodiment. In FIG. 11, the same reference symbols as those used in FIG. 4 represent the same components or equivalents, which are therefore not described here. The clock supply circuit 16c includes clock selectors 51c0, 51c1 and 51c2 for each cell block of the storage section 13 instead of the clock selectors 51a0 and 51a1 for each address of the storage section 13. The clock supply circuit 16c supplies clocks to each block (cell block) of memory cells of the storage section 13. In the example here, suppose that the storage section 13 includes eight memory cells and that four consecutive memory cells form one cell block. Suppose that the memory cells of addresses 0 to 3 form a cell block 0 and the memory cells of addresses 4 to 7 form a cell block 1.

The clock selectors 51c0, 51c1 and 51c2 each have a write pointer register 53, a read pointer register 54, two determination circuits 91 and 92, a two-input OR circuit 93, a NOT circuit 94 and a selector 95. The two determination circuits 91 and 92 and the two-input OR circuit 93 correspond to a control circuit; the NOT circuit 94 and the selector 95 correspond to a selection circuit. The output from the two-input OR circuit 93 corresponds to selection signals. When the address i of the memory cell of the storage section 13 is represented by four bits, j is represented by the upper two bits.

In the clock selectors 51c0, 51c1 and 51c2 corresponding to the cell block j, the determination circuit 91 makes a determination as to whether the upper two bits of the write pointer IP_REG [8:0] are equal to j; and the determination circuit 92 makes a determination as to whether the upper two bits of the read pointer OP_REG [8:0] are equal to j. The results of the two determination circuits 91 and 92 are inputted to the two-input OR circuit 93. Clocks outputted from the clock selectors 51c0, 51c1 and 51c2 corresponding to the cell block j are supplied to four memory cells in the cell block j.

According to the above configuration, when the value of the masked lower two bits of the write pointer IP_REG [8:0] is equal to j or when the value of the masked lower two bits of the read pointer OP_REG [8:0] is equal to j, the clock selectors 51c0, 51c1 and 51c2 corresponding to the cell block j supply the first clocks to the cell block j of the storage section 13. When the value of the masked lower two bits of the write pointer IP_REG [8:0] is not equal to j or when the value of the masked lower two bits of the read pointer OP_REG [8:0] is not equal to j, the clock selectors 51c0, 51c1 and 51c2 corresponding to the cell block j supply the second clocks to the cell block j of the storage section 13. That is, in the storage section 13, the cell block pointed by the write pointer register 11 or the read pointer register 12 operates at the first clocks; and the other cell blocks operate at the second clocks.

According to the present embodiment, it is enough for the clock supply circuit in this case to have clock selectors for each cell block. Therefore, the circuit is smaller in size than that of the first embodiment.

The second embodiment may be combined with the third embodiment. In this case, it is enough for the clock supply circuit to have PLL circuits for each cell block. Therefore, the circuit is smaller in size than that of the second embodiment.

The storage section for example includes either memory cells or cell blocks.

According to the above-described storage apparatus and method of controlling the storage apparatus, it is possible to reduce the power consumption of the storage apparatus.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A storage apparatus comprising:
a plurality of storage sections each of which corresponds to each of a plurality of addresses;
a read pointer register that outputs a read pointer indicating an address of a storage section from which data is read, out of the plurality of storage sections;
a write pointer register that outputs a write pointer indicating an address of a storage section to which data is written, out of the plurality of storage sections;
a control circuit that receives first clock signals of a first frequency and second clock signals of a second frequency that is different from the first frequency, determines selection signals indicating either the first clock signals or the second clock signals on the basis of the read pointer or the write pointer for each of the plurality of storage sections, and outputs the selection signals; and
selection circuits each of which is so provided as to correspond to each of the plurality of storage sections, selects signals indicated by the selection signals for each of the plurality of storage sections out of the first and second clock signals, and outputs the selected signals to each of the plurality of storage sections.

2. The storage apparatus according to claim 1, further comprising:
a first clock generation circuit that generates the first clock signals; and
a second clock generation circuit that generates the second clock signals.

3. The storage apparatus according to claim 1, wherein the first frequency is higher than the second frequency.

4. The storage apparatus according to claim 1, wherein the control circuit determines the selection signals indicating the first clock signals for a storage section corresponding to the address indicated by the read pointer or the write pointer out of the plurality of storage sections.

5. The storage apparatus according to claim 1, further comprising
a Phase Locked Loop circuit that receives reference clock signals of a third frequency and the selected signals, and adjusts the phase of the selected signals on the basis of the phase of the reference clock signals.

6. The storage apparatus according to claim 5, wherein the third frequency is equal to the first frequency or the second frequency.

7. A method of controlling a storage apparatus having a plurality of storage sections each of which corresponds to each of a plurality of addresses, comprising:
outputting a read pointer indicating an address of a storage section from which data is read, out of the plurality of storage sections, by using a read pointer register;
outputting a write pointer indicating an address of a storage section to which data is written, out of the plurality of storage sections;
receiving first clock signals of a first frequency and second clock signals of a second frequency that is different from the first frequency;
determining selection signals indicating either the first or second clock signals on the basis of the read pointer or the write pointer for each of the plurality of storage sections to output the selection signals;
selecting the signals indicated by the selection signals for each of the plurality of storage sections out of the first and second clock signals; and
outputting the selected signals to each of the plurality of storage sections.

8. The method of controlling the storage apparatus according to claim 7, wherein
the first frequency is higher than the second frequency.

9. The method of controlling the storage apparatus according to claim 7, wherein
the determining determines the selection signals indicating the first clock signals for the storage section corresponding to the address indicated by the read pointer or the write pointer.

10. The method of controlling the storage apparatus according to claim 7, further comprising:
inputting reference clock signals of a third frequency and the selected signals to a Phase Locked Loop circuit, and adjusts the phase of the selected signals on the basis of the phase of the reference clock signals by using the Phase Locked Loop circuit.

11. The method of controlling the storage apparatus according to claim 10, wherein
the third frequency is equal to the first frequency or the second frequency.

* * * * *